United States Patent
Hosomi et al.

(10) Patent No.: US 7,888,755 B2
(45) Date of Patent: Feb. 15, 2011

(54) MAGNETIC STORAGE DEVICE WITH INTERMEDIATE LAYERS HAVING DIFFERENT SHEET RESISTIVITIES

(75) Inventors: Masanori Hosomi, Kanagawa (JP); Kazuhiro Ohba, Miyagi (JP); Hiroshi Kano, Kanagawa (JP); Yiming Huai, Pleasanton, CA (US); Zhitao Diao, Fremont, CA (US); Mahendra Pakala, Fremont, CA (US)

(73) Assignee: Sony Corporation, Tokyo (JP)

( * ) Notice: Subject to any disclaimer, the term of this patent is extended or adjusted under 35 U.S.C. 154(b) by 1377 days.

(21) Appl. No.: 11/235,384

(22) Filed: Sep. 26, 2005

(65) Prior Publication Data

US 2006/0114618 A1  Jun. 1, 2006

(30) Foreign Application Priority Data

Sep. 24, 2004  (JP) .............................. 2004-277601

(51) Int. Cl.
*H01L 29/82* (2006.01)
*G11C 11/02* (2006.01)

(52) U.S. Cl. ........................ 257/421; 257/414; 257/427; 257/E29.323; 438/3; 360/324; 365/158; 365/171; 365/173

(58) Field of Classification Search .................. 257/20, 257/414, 421–427, E29.323; 438/3; 360/324–326, 360/313; 365/157–158, 171–173; 29/737
See application file for complete search history.

(56) References Cited

U.S. PATENT DOCUMENTS

| | | | | |
|---|---|---|---|---|
| 5,705,973 | A | * | 1/1998 | Yuan et al. ................. 338/32 R |
| 5,757,056 | A | * | 5/1998 | Chui ........................... 257/421 |
| 2002/0034094 | A1 | * | 3/2002 | Saito et al. .................. 365/158 |
| 2004/0027853 | A1 | | 2/2004 | Huai et al. |

FOREIGN PATENT DOCUMENTS

| | | |
|---|---|---|
| JP | 2001-313377 A | 11/2001 |
| JP | 2004-193595 A | 7/2004 |
| JP | 2005-535125 A | 11/2005 |
| JP | 2006-080241 A | 3/2006 |

* cited by examiner

*Primary Examiner*—Bradley K Smith
*Assistant Examiner*—Jami M Valentine
(74) *Attorney, Agent, or Firm*—Wolf, Greenfield & Sacks, P.C.

(57) ABSTRACT

A storage element 3 has an arrangement in which magnetization fixed layers 31 and 32 are provided above and below a storage layer 17 for storing information based on the magnetization state of a magnetic material through intermediate layers 16 and 18, directions of magnetizations M15 and M19 of ferromagnetic layers 15 and 19 closest to the storage layer 17 of the magnetization fixed layers 31 and 32 above and below the storage layer 17 are opposite to each other, the two intermediate layers 16 and 18 above and below the storage layer 17 have a significant difference between sheet resistivity values thereof and in which the direction of a magnetization M1 of the storage layer 17 is changed with application of an electric current to the lamination layer direction to record information on the storage layer 17.

10 Claims, 3 Drawing Sheets

US 7,888,755 B2

MAGNETIC STORAGE DEVICE WITH INTERMEDIATE LAYERS HAVING DIFFERENT SHEET RESISTIVITIES

CROSS REFERENCES TO RELATED APPLICATIONS

The present invention contains subject matter related to Japanese Patent Application JP 2004-277601 filed in the Japanese Patent Office on Sep. 24, 2004, the entire contents of which being incorporated herein by reference.

BACKGROUND OF THE INVENTION

1. Field of the Invention

The present invention relates to a storage element composed of a storage layer to store therein the magnetization state of a ferromagnetic layer as information and a magnetization fixed layer whose direction of magnetization is fixed, the direction of the magnetization of the storage layer being changed with application of an electric current and a memory including this storage element. More particularly, the present invention is suitable for use as the application to a nonvolatile memory.

2. Description of the Related Art

In information equipment such as a computer, a DRAM (dynamic random-access memory) operable at a high speed and which is high in density is widely used as a random-access memory (RAM).

However, since the DRAM is a volatile memory whose stored information is lost when operating power is removed, a nonvolatile memory whose information may not be lost even when operating power is removed has been desired.

Then, a magnetic random-access memory (MRAM) capable of recording information based on magnetization of a magnetic material receives a remarkable attention as a nominated nonvolatile memory and it is now under development (see Cited Non-Patent Reference 1, for example).

The MRAM is able to record information by inverting magnetization of a magnetic layer of a magnetic storage element located at an intersection point of address wirings based on electric current magnetic fields generated from address wirings with application of electric currents to two kinds of address wirings (word line and bit line) substantially perpendicular to each other.

FIG. 1 of the accompanying drawings is a schematic diagram (perspective view) showing an arrangement of a MRAM according to the related art.

As shown in FIG. 1, a drain region 108, a source region 107 and a gate electrode 101 constructing a selection transistor to select each memory cell are respectively formed on a semiconductor substrate 110 such as a silicon substrate at its portions isolated by an element isolation layer 102.

Also, a word line 105 that is extended in the front and back direction in FIG. 1 is provided over the gate electrode 101.

The drain region 108 is formed common to the right and left selection transistors in FIG. 1 and a wiring 109 is connected to this drain region 108.

A magnetic storage element 103 including a storage layer of which magnetization direction is inverted is located between the word line 105 and a bit line 106 located above the word line 105 and which is extended in the right and left direction in FIG. 1. This magnetic storage element 103 is composed of a magnetic tunnel junction device (MTJ device), for example.

Further, the magnetic storage element 103 is electrically connected to the source region 107 through a bypass line 111 of the horizontal direction and a contact layer 104 of the upper and lower direction.

When electric currents flow through the word line 105 and the bit line 106, respectively, an electric current magnetic field is applied to the magnetic storage element 103 to invert the magnetization direction of the storage layer of the magnetic storage element 103, thereby making it possible to record information in the storage layer.

Then, in the magnetic memory such as the MRAM, in order to stably hold recorded information, it is necessary that a magnetic layer (storage layer) to record information should have constant coercive force.

On the other hand, in order to rewrite recorded information, an electric current of a certain magnitude should flow through the address wiring.

However, as the element constructing the MRAM is microminiaturized increasingly, the address wiring also is decreased in thickness so that an electric current of a sufficient magnitude may not flow through such thin address wiring.

Magnetization inversion done by spin injection is that magnetization in other magnetic material may be inverted by injecting spin polarized electrons, which have passed the magnetic material, into other magnetic material.

For example, when an electric current flows through a giant magnetoresistive effect device (GMR device) or a magnetic tunnel junction device (MTJ device) in the direction perpendicular to the film plane, the magnetization direction of at least a part of the magnetic layer of these devices can be inverted.

The magnetization inversion based on spin injection has a merit in that, even when the element is microminiaturized, magnetic inversion can be realized by a small electric current.

FIGS. 2 and 3 are schematic diagrams showing a magnetic memory having an arrangement using the above-mentioned magnetization inversion based on spin injection. FIG. 2 is a perspective view showing a magnetic memory and FIG. 3 is a cross-sectional view thereof.

As illustrated, a drain region 58, a source region 57 and a gate electrode 51 constructing a selection transistor to select each memory cell are respectively formed on a semiconductor substrate 60 such as a silicon substrate at its portions isolated by an element isolation layer 52. Of these elements, the gate electrode 51 serves as a word line extended in the front and back direction in FIG. 2 as well.

The drain region 58 is formed common to right and left selection transistors in FIG. 2 and a wiring 59 is connected to this drain region 58.

A storage element 53 including a storage layer whose magnetization direction is inverted based on spin injection is located between the source region 57 and the bit line 56 extended in the right and left direction in FIG. 2.

This storage element 53 is composed of a magnetic tunnel junction element (MTJ device), for example. In FIG. 3, reference numerals 61 and 62 denote magnetic layers. Of the magnetic layers 61 and 62 of the two layers, one magnetic layer is used as a magnetization fixed layer of which magnetization direction is fixed and the other magnetic layer is used as a magnetization free layer of which magnetization direction may be changed, that is, storage layer.

Also, the storage element 53 is connected to the bit line 56 and the source region 57 through upper and lower contact layers 54. As a result, with application of an electric current to the magnetic memory element 53, it is possible to invert the magnetization direction of the storage layer based on spin injection.

The above-mentioned memory having the arrangement using magnetization inversion based on spin injection has features in that a device structure can be simplified as compared with the ordinary MRAM shown in FIG. 1.

Also, this memory has a merit in that, since the magnetization inversion based on spin injection is used, even when the element is microminiaturized increasingly, a write electric current can be prevented from being increased as compared with the ordinary MRAM which may invert the magnetization direction based on external magnetic fields.

In the above-mentioned memory having the arrangement to use the magnetization inversion based on the spin injection, in order to suppress power consumption more, it is necessary to decrease an inputted electric current by improving spin injection efficiency.

Also, in order to increase a magnitude of a read signal, it is necessary to maintain a large magnetoresistance variation. To this end, it is effective in making intermediate layers adjoining both sides of the storage layer become tunnel barrier layers.

In this case, it is inevitable that a withstand voltage of a barrier layer will be limited. From this point of view, it is necessary to suppress an electric current required upon spin injection.

Therefore, as a solution for suppressing an electric current required upon spin injection, there has been proposed an arrangement in which a storage element has a lamination layer structure of magnetization fixed layer/intermediate layer/storage layer/intermediate layer/magnetization fixed layer such that magnetization directions of magnetization fixed layers provided above and below a storage layer may be directed in the opposite directions (see Cited Patent Reference 2).

Then, the above-described Cited Patent Reference 2 discloses the fact that spin injection efficiency can be doubled by making the magnetization directions of the upper and lower magnetization fixed layers become opposite to each other.

[Cited Non-Patent Reference 1]: NIKKEI ELECTRONICS, 2001, Vol. 2. 12 (pp. 164 to 171)

[Cited Patent Reference 1]: Official Gazette of Japanese laid-open patent application No. 2003-17782

[Cited Patent Reference 2]: Specification of U.S. laid-open patent application No. 2004/0027853

Undoubtedly, from a theory standpoint, it is considered that spin injection efficiency can be doubled by the structure described in the above-described cited patent reference 2.

However, having manufactured a storage element having the structure described in the above-described cited patent reference 2 in actual practice and examined characteristics of this storage element, it is to be appreciated that satisfactory results could not be obtained theoretically so that satisfactory improvements of spin injection efficiency could not be recognized.

SUMMARY OF THE INVENTION

In view of the aforesaid aspects, the present invention intends to provide a storage element in which an electric current value required to write information can be decreased by improving spin injection efficiency.

Also, the present invention intends to provide a memory including this storage element.

According to an aspect of the present invention, there is provided a storage element which is composed of a storage layer for storing therein information based on the magnetization state of a magnetic material and magnetization fixed layers provided above and below the storage layer through intermediate layers, both of the intermediate layers being formed of insulating layers, wherein magnetization directions of ferromagnetic layers closest to the storage layer are opposite to each other in the magnetization fixed layers above and below the storage layer, the magnetization direction of the storage layer is changed with application of an electric current to the laminated direction to record information on the storage layer, the two intermediate layers above and below the storage layer have a significant difference between sheet resistivity values thereof and a magnetoresistance variation of the intermediate layer having a high sheet resistivity value is larger than that of the intermediate layer having a low sheet resistivity value.

According to the above-mentioned arrangement of the storage element of the present invention, since the storage element includes the storage layer to store information based on the magnetization state of the magnetic material, the magnetization fixed layers are provided above and below this storage layer through the intermediate layers and the magnetization direction of the storage layer is changed with application of the electric current to the lamination layer direction to record information on the storage layer, information can be recorded on the storage layer based on the spin injection with application of the electric current to the lamination layer direction.

Also, in the magnetization fixed layers above and below the storage layer, since the directions of the magnetizations of the ferromagnetic layers closest to the storage layer are opposite to each other, it becomes possible to considerably increase spin injection efficiency. As a result, it is possible to decrease an electric current amount (threshold electric current) required to invert the direction of the magnetization of the storage layer based on the spin injection.

Further, since the two intermediate layers are all made of the insulating layers, current (spin current) of polarized electrons can be suppressed from being attenuated by the insulating layers and thereby can be maintained. As a result, it is possible to decrease an electric current amount (threshold electric current) required to invert the direction of the magnetization of the storage layer based on the spin injection by further improving the spin injection efficiency.

Then, since the two intermediate layers above and below the storage layer have the significant difference between the sheet resistivity values thereof and the magnetoresistance variation of the intermediate layer having the high sheet resistivity value is larger than that of the intermediate layer having the low sheet resistivity value, even when the magnetoresistance variations of the respective intermediate layers are canceled each other out, it becomes possible to maintain the magnetoresistance variation of the sufficiently large magnitude of the whole of the storage element.

According to other aspect of the present invention, there is provided a storage element which is composed of a storage layer for storing therein information based on the magnetization state of a magnetic material and magnetization fixed layers provided above and below the storage layer through intermediate layers, both of the intermediate layers being formed of insulating layers, wherein magnetization directions of ferromagnetic layers closest to the storage layer are opposite to each other in the magnetization fixed layers above and below the storage layer, the magnetization direction of the storage layer is changed with application of an electric current to the laminated direction to record information on the storage layer, the two intermediate layers above and below the storage layer have a significant difference between sheet resistivity values thereof and a sheet resistivity value of one of the intermediate layers is larger than twice of a sheet resistivity value of the other of the intermediate layers.

According to the above-mentioned arrangement of the storage element of the present invention, since the storage element includes the storage layer to store information based on the magnetization state of the magnetic material, the magnetization fixed layers are provided above and below this storage layer through the intermediate layers and the magnetization direction of the storage layer is changed with application of the electric current to the lamination layer direction to record information on the storage layer, information can be recorded on the storage layer based on the spin injection with application of the electric current to the lamination layer direction.

Also, in the magnetization fixed layers above and below the storage layer, since the directions of the magnetizations of the ferromagnetic layers closest to the storage layer are opposite to each other, it becomes possible to considerably increase spin injection efficiency. As a result, it is possible to decrease an electric current amount (threshold electric current) required to invert the direction of the magnetization of the storage layer based on the spin injection.

Further, since the two intermediate layers are all made of the insulating layers, current (spin current) of polarized electrons can be suppressed from being attenuated by the insulating layers and thereby can be maintained. As a result, it is possible to decrease an electric current amount (threshold electric current) required to invert the direction of the magnetization of the storage layer based on the spin injection by further improving the spin injection efficiency.

Then, since the two intermediate layers above and below the storage layer have the significant difference between the sheet resistivity values thereof and the magnetoresistance variation of one intermediate layer is larger than twice that of the other intermediate layer, even when the magnetoresistance variations of the respective intermediate layers are canceled each other out, it becomes possible to maintain the magnetoresistance variation of the sufficiently large magnitude of the whole of the storage element.

According to a further aspect of the present invention, there is provided a memory which is composed of a storage element including a storage layer for storing information based on the magnetization state of a magnetic material and two kinds of wirings crossing to each other, wherein the storage element includes magnetization fixed layers provided above and below the storage layer through intermediate layers, the two intermediate layers are all made of insulating layers, magnetization directions of ferromagnetic layers closest to the storage layer are opposite to each other in the magnetization fixed layers above and below the storage layer, the magnetization direction of the storage layer is changed with application of an electric current to the lamination layer direction to record information on the storage layer, the two intermediate layers above and below the storage layer have a significant difference between sheet resistivity values thereof, magnetoresistance variation of the intermediate layer having a high sheet resistivity value is larger than that of the intermediate layer having a low sheet resistivity value, the storage element is located near an intersection point between the two kinds of wirings and between the two kinds of wirings and an electric current flows through the two kinds of wirings to the storage element along the lamination layer direction.

According to the above-mentioned arrangement of the memory of the present invention, since the memory is composed of the storage element including the storage layer to store information based on the magnetization state of the magnetic material and the two kinds of wiring crossing to each other, the storage element has the arrangement of the storage element of the present invention, the storage element is located near the intersection point of the two kinds of wirings and between the two kinds of wirings and the electric current flows through these two kinds of wirings to the storage element along the lamination layer direction, information can be recorded on the storage layer based on the spin injection with application of the electric current through the two kinds of wirings to the storage element along the lamination layer direction.

Also, it is possible to decrease the electric current amount (threshold electric current) required to invert the magnetization direction of the storage layer of the storage element based on the spin injection.

Further, since the magnetoresistance variation of the storage element is sufficiently large, if information is read out from the storage layer of the storage element by using the magnetoresistance variation, then the high output can be obtained and hence information can be easily read out from the storage layer of the storage element.

In accordance with yet a further aspect of the present invention, there is provided a memory which is composed of a storage element including a storage layer for storing information based on the magnetization state of a magnetic material and two kinds of wirings crossing to each other, wherein the storage element includes magnetization fixed layers provided above and below the storage layer through intermediate layers, the two intermediate layers are all made of insulating layers, magnetization directions of ferromagnetic layers closest to the storage layer are opposite to each other in the magnetization fixed layers above and below the storage layer, the magnetization direction of the storage layer is changed with application of an electric current to the lamination layer direction to record information on the storage layer, the two intermediate layers above and below the storage layer have a significant difference between sheet resistivity values thereof, a sheet resistance of one of the intermediate layers is larger than twice that of the other of the intermediate layer, the storage element is located near an intersection point between the two kinds of wirings and between the two kinds of wirings and an electric current flows through the two kinds of wirings to the storage element along the lamination layer direction.

According to the above-mentioned arrangement of the memory of the present invention, since the memory is composed of the storage element including the storage layer to store information based on the magnetization state of the magnetic material and the two kinds of wiring crossing to each other, the storage element has the arrangement of the storage element of the present invention, the storage element is located near the intersection point of the two kinds of wirings and between the two kinds of wirings and the electric current flows through these two kinds of wirings to the storage element along the laminated direction, information can be recorded on the storage layer based on the spin injection with application of the electric current through the two kinds of wirings to the storage element along the lamination layer direction.

Also, it is possible to decrease the electric current amount (threshold electric current) required to invert the magnetization direction of the storage layer of the storage element based on the spin injection.

Further, since the magnetoresistance variation of the storage element is sufficiently large, if information is read out from the storage layer of the storage element by using the magnetoresistance variation, then the high output can be obtained and hence information can be easily read out from the storage layer of the storage element.

According to the above-mentioned present invention, it is possible to decrease the electric current amount required to record information by improving the spin injection efficiency.

As a consequence, it becomes possible to decrease power consumption of the whole of the memory.

Accordingly, it becomes possible to realize the memory with low power consumption that has never existed in the related art.

Also, according to the present invention, when recorded information is read, high output can be obtained and hence it becomes possible to read information easily.

As a result, in the memory including the storage element, the electric current applied to the storage element when information is read, for example, can be decreased, whereby it becomes possible to decrease power consumption required upon reading and the arrangement such as a circuit for detecting an output can be simplified.

DESCRIPTION OF THE PREFERRED EMBODIMENTS

Figure 1:
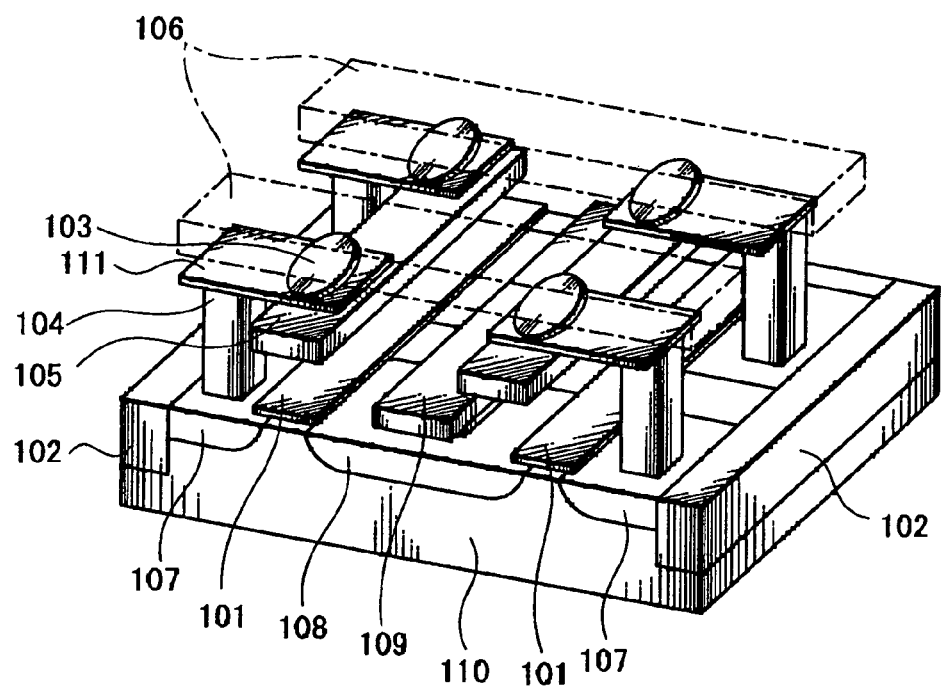
FIG. 1 is a perspective view schematically showing an arrangement of an MRAM (magnetic random-access memory) according to the related art.

Prior to the description of the specific embodiments of the present invention, an outline of the present invention will be described.

According to the present invention, information can be recorded by inverting the direction of the storage layer of the storage element based on the aforementioned spin injection. The storage layer is made of a magnetic material such as a ferromagnetic layer and it can store information based on the magnetization state (magnetization direction) of the magnetic material.

In the fundamental operation to invert a magnetization direction of a magnetic layer based on spin injection, an electric current greater than a certain threshold value is applied to a storage element formed of a giant magnetoresistive effect device (GMR device) or a tunnel magnetoresistive effect device (MTJ device) in the direction perpendicular to the film plane. At that time, a polarity (direction) of the electric current depends on the magnetization direction to be inverted.

When an electric current whose absolute value is smaller than this threshold value is applied to the storage element, the magnetization direction is not inverted.

A threshold value Ic of an electric current required when the magnetization direction of the magnetic layer is inverted based on spin injection is expressed by the following equation (1) from a phenomenalism standpoint (see Applied Physics Letters 77, written by F. J. Albert et al., page 3809, 2000, etc., for example).

$$Ic^{\pm}=kMsV(Hk^{effective})/g^{\pm} \quad (1)$$

where k is the constant, $g^{\pm}$ is the inversion coefficient inherent in the material and which corresponds to positive and negative electric current polarities, $Hk^{effective}$ is the effective magnetic anisotropy, Ms is the saturation magnetization of the magnetic layer and V is the volume of the magnetic layer.

As expressed in the above-mentioned equation (1), the present invention may use the fact that it is possible to arbitrarily set the threshold value of the electric current by controlling the volume V of the magnetic layer, the saturation magnetization Ms of the magnetic layer and the magnitude of the effective magnetic anisotropy.

Then, there is constructed the storage element including the magnetic layer (storage layer) capable of storing information based on the magnetization state and the magnetization fixed layer of which magnetization direction is fixed.

Let us consider the threshold value of the electric current to change the magnetization state of the storage layer. In actual practice, in a giant magnetoresistive effect device (GMR device) having a storage layer with a thickness of 2 nm and of which plane pattern is in the form of approximately an ellipse of 120 to 130 nm×100 nm, a positive side (+ side) threshold value +Ic is equal to +0.6 mA (+Ic=+0.6 mA) and a negative side (− side) threshold value −Ic is equal to −0.2 mA (−Ic=−0.2 mA). An electric current obtained at that time is approximately $6\times10^6$ A·cm². These numerical values are substantially coincident to the above-described equation (1) (see Journal of the Magnetic Society of Japan written by Onoue et al., Vol. 28, No. 2, page 149, 2004).

On the other hand, the ordinary MRAM capable of inverting magnetization based on an electric current magnetic field needs a write electric current higher than several milliamperes (mA).

On the other hand, when the magnetization is inverted by spin injection, since the threshold value of the write electric current is decreased sufficiently as described above, it is to be understood that the present invention is effective in decreasing power consumption of an integrated circuit.

Also, since the electric current magnetic field generating wiring (wiring 105 in FIG. 1) that is required by the ordinary MRAM becomes unnecessary, the present invention is advantageous also in integration degree as compared with the ordinary MRAM.

Then, as is described in the above-described cited patent reference 2, if the storage element has the arrangement in which it has the magnetization fixed layers provided above and below the storage layer and in which the magnetization directions of the magnetization fixed layers above and below the storage layer are made opposite to each other, then it is considered from a theory standpoint that an electric current required in spin injection can be decreased by improving spin injection efficiency.

Also, according to the arrangement in which the magnetization fixed layers are provided above and below the storage layer and the magnetoresistive devices are formed above and below the magnetization fixed layers, that is, the laminated structure of magnetization fixed layer/intermediate layer/ storage layer/intermediate layer/magnetization fixed layer is constructed and in which the magnetization directions of the upper and lower magnetization fixed layers are made opposite to each other, resistance changes obtained when the magnetization direction of the storage layer is inverted are canceled each other out in the upper and lower magnetoresistive device.

Accordingly, in order to obtain much more resistance changes, the upper and lower magnetoresistive devices should have asymmetric structures.

In the arrangement described in the above-described cited patent reference 2, one intermediate layer is formed of the insulating layer and the other intermediate layer is formed of the nonmagnetic conductive layer, whereby the structures of the upper and lower magnetoresistive device are made asymmetric.

As a consequence, since the resistance change of the magnetoresistive device including one intermediate layer is increased and the resistance change of the magnetoresistive device including the other intermediate layer is decreased, even when the resistance changes of the two magnetoresistive devices are canceled each other out, it becomes possible to obtain a certain magnitude of the resistance change of the whole of the magnetoresistive device.

However, when the other intermediate layer is formed of the nonmagnetic conductive layer, for example, a Cu layer, spin injection efficiency might not be sufficiently improved in the storage element which was manufactured in actual practice.

The reason for this may be considered as follows. If the intermediate layer is formed of the nonmagnetic conductive layer, then since a current through which polarized electrons are transmitted, that is, so-called spin current becomes difficult to return from the magnetization fixed layer even when it reached the magnetization fixed layer from the storage layer, spin current is unavoidably attenuated so that the magnetization direction of the storage layer may not be inverted efficiently.

After various examinations, it was discovered that spin injection efficiency could be improved when the upper and lower intermediate layers of the storage layer were both formed of insulating layers (oxide, nitride, etc.).

More specifically, if a storage layer has an arrangement in which both of upper side and lower side of a storage layer are formed as MTJ devices, then it is possible to improve spin injection efficiency.

However, even when the intermediate layers above and below the storage layer are both formed of the insulating layers, since magnetoresistance variation actions of the upper and lower magnetoresistive effect devices are canceled each other out, without any modifications or variations, the magnetoresistance variation of the whole of the storage element is decreased, thereby making it difficult to read the information from the storage layer.

Therefore, according to the present invention, the arrangements of the upper and lower intermediate layers (insulating layers) of the storage layer are made different to make the structures of the upper and lower magnetoresistive devices of the storage element become asymmetric, whereby the magnetoresistance variation of the whole of the storage element can be increased.

More specifically, the storage element has the arrangement in which the upper and lower intermediate layers (insulating layers) of the storage layer have a significant difference between sheet resistvity values thereof and in which the insulating layer having the high resistance value has a magnetoresistance variation as high as possible.

Specifically, the storage element may have the arrangement in which the magnetoresistance variation of the high resistance side, for example, larger than that of the low resistance side or in which the sheet resistivity value of the high resistance side is greater than twice the sheet resistivity value of the low resistance side.

Thus, it becomes possible to decrease an electric current value necessary for inverting the magnetization direction half as compared with the ordinary arrangement of the storage element capable of recording information based on the spin injection.

Oxide and nitride can be used as a material of an insulating layer.

For example, aluminum oxide, aluminum nitride, magnesium oxide and the like can be enumerated and an insulating layer may be mainly made of these oxide and nitride.

The aluminum oxide can be formed by oxidizing an Al (aluminum) layer after a metal Al layer, for example, was formed.

The aluminum nitride can be formed by nitriding an Al layer after a metal Al layer, for example, was formed.

The magnesium oxide can be formed by directly depositing oxide according to an RF (radio frequency) sputtering method, for example.

Subsequently, the conditions in which the storage element may satisfy the above-mentioned characteristics will be described.

First, in the arrangement of the magnetoresistive effect device (magnetization fixed layer/insulating layer/recording layer) of the high resistance side, in order to obtain magnetoresistive effect as large as possible, it is requested that insulation property should be high and resistance should be high.

To this end, when an insulating layer, for example, is formed, metal layers such as an Al layer and an Mg layer should be oxidized or nitrided sufficiently.

It is desirable that a sheet resistivity value RA ($\Omega\mu m^2$) of a magnetoresistive effect device of this high resistance side should fall within a range of from 5 $\Omega\mu m^2$ to 150 $\Omega\mu m^2$.

When the sheet resistivity value RA is less than 5 $\Omega\mu m^2$, if a film thickness of an insulating layer is decreased in order to obtain a sufficient magnetoresistive effect, then pinholes are formed frequently so that a uniform resistance value may not be obtained stably.

Also, if the sheet resistivity value RA is higher than 150 $\Omega\mu m^2$, then resistance becomes too high so that a minimum electric current value (inverting electric current value) to invert the magnetization direction of the recording layer is increased. As a consequence, if an electric current greater than the inverting electric current value) is applied to the storage element, then such electric current exceeds an insulating withstand voltage of the insulating layer with the result that the insulating layer is broken.

Also, it is requested that the arrangement of the magnetoresistive effect device (magnetization fixed layer/insulating layer/storage layer) of the low resistance side should have a significant difference of sheet resistivity value between it and the high resistance side, that it should be slightly low in insulating property, low in resistance and that it should have a small magnetoresistance variation.

To this end, when the insulating layer, for example, is formed, a metal layer such as an Al layer and a Ti layer is not sufficiently oxidized or nitrided so that the metal layer is placed in the insufficient oxidized or nitrided state.

However, when the metal layer which is not yet oxidized or nitrided is too thin, pinholes are formed upon oxidation or nitriding so that insulating properties may not be obtained. Therefore, it is necessary that the metal layer should maintain a film thickness greater than a certain constant film thickness.

When a metal layer is formed of an Al layer, it is necessary that a film thickness greater than 0.3 nm should be maintained.

It is desirable that the sheet resistivity value RA ($\Omega\mu m^2$) of the magnetoresistive effect device of this low resistance side should fall within a range of from 300 m$\Omega\mu m^2$ to 30 $\Omega\mu m^2$.

If the sheet resistance RA is less than 30 $\Omega\mu m^2$, the degree of oxidation or nitriding is too small so that the metal layer may serve only as a metal layer, thereby making it impossible to accomplish properties of the insulating layer.

Also, if the sheet resistivity value RA is greater than 30 $\Omega\mu m^2$, a difference between the sheet resistivity value of the magenetoresistive effect device of the low resistance side and the sheet resistivity value of the magnetoresistive effect device of the high resistance side is decreased and the amount in which actions of the magnetoresistive variations are canceled each other out may not be neglected. As a result, the magnetoresistance variation of the whole of the storage element is decreased unavoidably.

Further, in order to obtain an optimum tunnel magnetoresistive effect, combinations of materials of a ferromagnetic layer of a magnetization fixed layer/insulating layer/ferromagnetic layer of storage layer are also important.

It is desirable that the ferromagnetic layers of the magnetization fixed layer and the storage layer adjoining the insulating layer on the high resistance side should be formed of materials having a large spin polarizability and that the material should be combined so as to increase a magnetoresistance variation.

Specifically, the ferromagnetic layer adjoining the insulating layer may be made of a Co—Fe-based ferromagnetic material such as a CoFe alloy with a composition ratio of $Co_{60}Fe_{40}$ (atomic %) and it may also be made of an amorphous material in which Boron B of 20 to 30 atomic % was added to the above Co—Fe-based ferromagnetic material and the like.

Also, when the insulating layer is made of a magnesium-based oxide and the ferromagnetic layer adjoining the insulating layer is made of an iron-based material, a very large magnetoresistance variation can be obtained so that such combination may be desirable.

Then, the insulating layer on the high resistance side may be made of mainly magnesium oxide and the insulating layer on the low resistance side may be made of mainly any one of aluminum oxide, aluminum nitride and magnesium oxide.

Although the low resistance side needs a material having a satisfactory spin polarizability in order to improve spin injection efficiency, it is desirable that materials should be combined so that a magnetoresistance variation may be prevented from being increased.

Also, in the low resistance side, it is effective that a thin nonmagnetic metal layer should be inserted between the magnetization fixed layer and the insulating layer. It is desirable that this nonmagnetic metal layer should be made of a suitable material such as Pt, Au, Ru, Ag, Pd and Rh and that its film thickness should be selected to be less than 2 nm.

Also, it is similarly effective that a thin nonmagnetic metal layer should be inserted between the storage layer and the insulating layer.

As described above, if the thin nonmagnetic metal layer is inserted between the storage layer and the insulating layer, then spin current can be maintained without being attenuated and a magnetoresistance variation can be suppressed.

Other arrangement of the storage element can be selected to be similar to the well-known and related-art arrangement of the storage element for recording information based on the spin injection.

The magnetization fixed layer may have an arrangement in which its magnetization direction is fixed by using only a ferromagnetic layer or by using antiferromagnetic bond.

Also, the magnetization fixed layer and the storage layer may have structures made of a ferromagnetic layer of a single layer or a lamination layer ferri structure in which ferromagnetic layers of a plurality of layers are laminated through nonmagnetic layers.

As a method for reading information from the storage layer of the storage element, a magnetic layer which serves as reference of information may be provided on the storage layer of the storage element through a thin insulating layer and recorded information may be read out from the storage layer of the storage element by either a ferromagnetic tunnel electric current flowing through the insulating layer or by a magnetoresistive effect.

Subsequently, embodiments of the present invention will be described.

Figure 4:
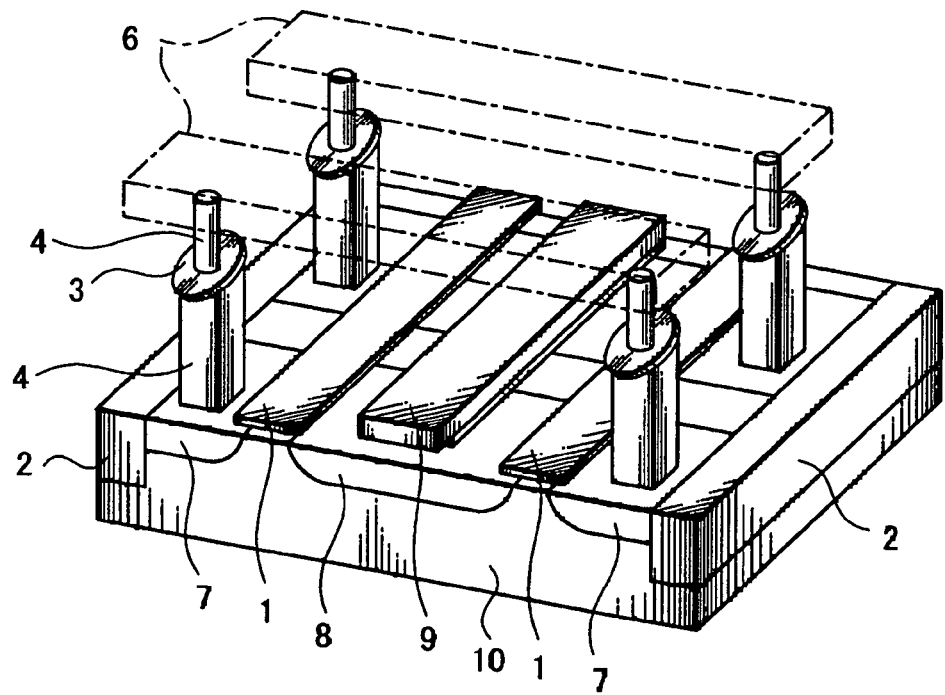
FIG. 4 is a schematic diagram (perspective view) showing an arrangement of a memory according to an embodiment of the present invention.

FIG. 4 is a schematic diagram (perspective view) showing an arrangement of a memory according to an embodiment of the present invention.

This memory includes a storage element capable of storing information based on the magnetization state and which is located near an intersection point between two kinds of address wirings (for example, word line and bit line) perpendicular to each other.

More specifically, a drain region 8, a source region 7 and a gate electrode 2 constructing a selection transistor to select each memory cell are respectively formed on a semiconductor substrate 10 such as a silicon substrate at its portions isolated by an element isolation layer 2. Of these elements, the gate electrode 1 serves as one address wiring (for example, word line), which extends in the front and back direction in FIG. 4, as well.

The drain region 8 is formed common to right and left selection transistors in FIG. 4 and a wiring 9 is connected to this drain region 8.

The storage element 3 is located between the source region 7 and the other address wiring (for example, bit line) 6 located above the source region 7 and which is extended in the right and left direction in FIG. 4.

This storage element 3 includes a storage layer composed of a ferromagnetic layer of which magnetization direction is inverted by spin injection.

Also, this storage element 3 is located near the intersection point between the two kinds of the address wirings 1 and 6.

This storage element 3 is connected to the bit line 6 and the source region 7 through the upper and lower contact layers 4.

Consequently, with application of an electric current to the storage element 3 through the two kinds of the address wirings 1 and 6 in the upper and lower direction, it is possible to invert the magnetization direction of the storage layer based on spin injection.

Figure 2:
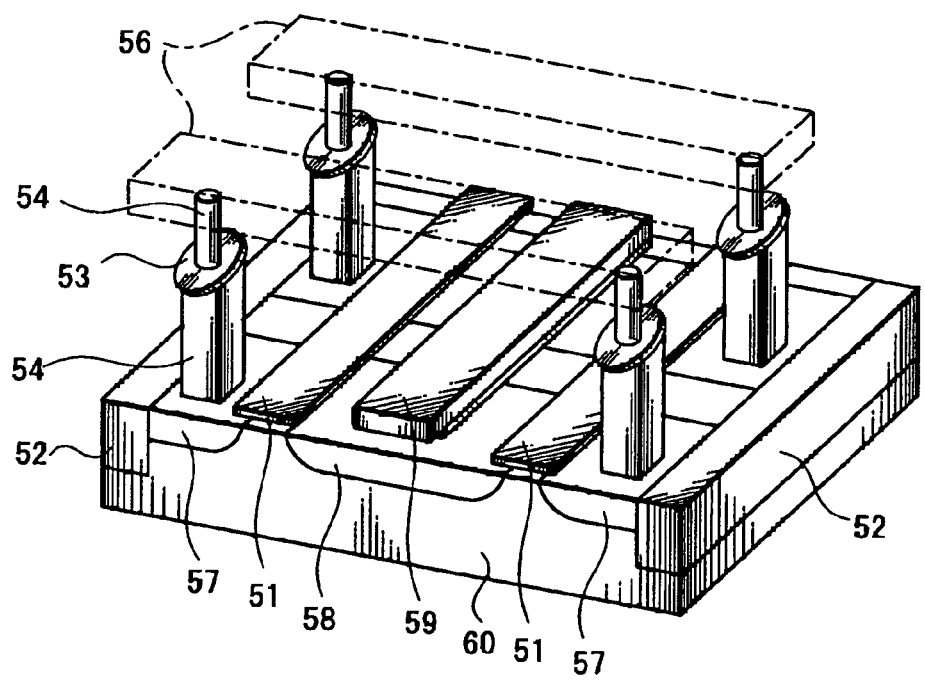
FIG. 2 is a schematic diagram (perspective view) showing an arrangement of a memory using magnetization inversion based on spin injection according to the related art.
Figure 3:
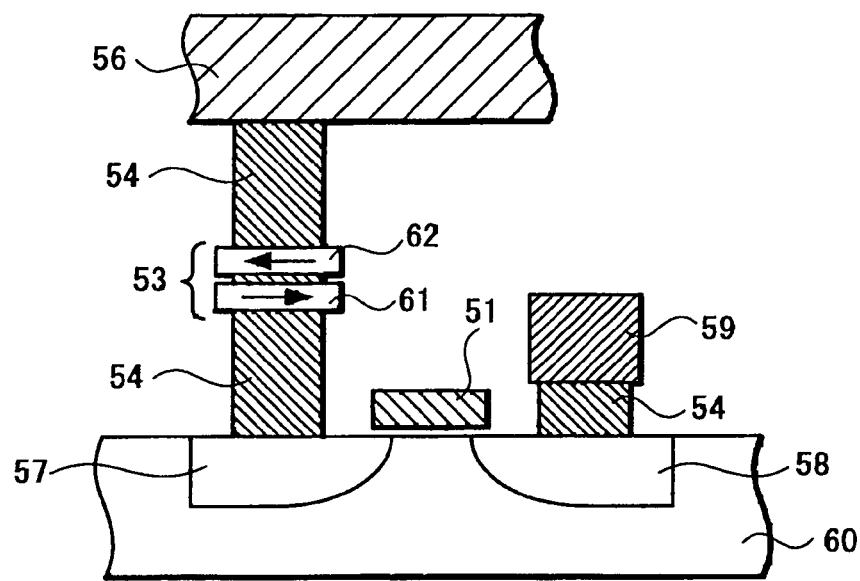
FIG. 3 is a cross-sectional view of the memory shown in FIG. 2 according to the related art.

FIG. 2 is a cross-sectional view showing the storage element 3 of the memory according to the embodiment of the present invention.

As shown in FIG. 2, a first magnetization fixed layer 31 is provided below a storage layer 18 whose direction of a magnetization M1 is inverted by spin injection and a second magnetization fixed layer 32 is provided above the storage layer 17. That is, the upper and lower magnetization layers 31 and 32 are provided relative to the storage layer 17.

An antiferromagnetic layer 12 is provided below the first magnetization fixed layer 31 and the magnetization direction of the first magnetization fixed layer 31 is fixed by this antiferromagnetic layer 12. Also, an antiferromagnetic layer 20 is provided above the second magnetization fixed layer 32 and the magnetization direction of the second magnetization fixed layer 32 is fixed by this antiferromagnetic layer 20.

Then, the first magnetization fixed layer 31 has a lamination ferri structure.

To be more concrete, the first magnetization fixed layer 31 has an arrangement in which ferromagnetic layers 13 and 15 of two layers are laminated through a nonmagnetic layer 14 and thereby bonded in an antiferromagnetic fashion.

Because the two ferromagnetic layers 13 and 15 of the first magnetization fixed layer 31 have the lamination layer ferri structure, a magnetization M13 of this ferromagnetic layer 13 is directed in the right-hand side and a magnetization M15 of the ferromagnetic layer 15 is directed in the left-hand side and thereby they are directed in the opposite directions.

As a consequence, magnetic fluxes leaked from the two ferromagnetic layers 13 and 15 of the first magnetization fixed layer 31 may be canceled each other out.

On the other hand, the second magnetization fixed layer 32 has an arrangement in which it includes only a ferromagnetic layer 19 of a single layer.

Also, an underlayer 11 is formed below the antiferromagnetic layer 12 and a capping layer 21 is formed above the antiferromagnetic layer 20.

A material of the storage layer 17 is not limited in particular, and an alloy material formed of one kind or more than two kinds of iron, nickel and cobalt can be used as the material of the storage layer 17. Further, the material of the storage layer 17 may contain transition metal elements such as Nb and Zr and light element such as B. Also, like a lamination layer film of CoFe/NiFe/CoFe, for example, a plurality of films made of different materials may be laminated directly (not through a nonmagnetic layer) to construct the storage layer 17.

The materials of the ferromagnetic layers 13, 15 and 19 of the magnetization fixed layers 31 and 32 may not be limited in particular, and an alloy material made of one kind or more than two kinds of iron, nickel and cobalt can be used as the materials of the ferromagnetic layers 13, 15 and 19 of the magnetization fixed layers 31 and 32. Further, the ferromagnetic layers 13, 15 and 19 of the magnetization fixed layers 31 and 32 may contain transition metal element such as Nb and Zr and light metal such as B.

As the material of the nonmagnetic layer 14 constructing the lamination layer ferri structure o the first magnetization fixed layer 31, there can be used ruthenium, copper, chromium, gold, silver and the like. Although a film thickness of the nonmagnetic material 14 is fluctuated depending on the materials, it should preferably be selected in a range of from nearly 0.5 nm to 2.5 nm.

As the material of the antiferromagnetic layers 12 and 20, there can be used alloy of metal elements such as iron, nickel, platinum, iridium and rhodium and manganese and oxide such as cobalt and nickel and the like.

In this embodiment, in particular, intermediate layers among the first magnetization fixed layer 31 and the second magnetization fixed layer 32 of the storage element 3 and the storage layer 17 may be both formed of insulating layers.

Specifically, a first insulating layer 16 that serves as a tunnel barrier layer (tunnel insulating layer) is provided between the storage layer 17 and the first magnetization fixed layer 31 of the lower layer and the storage layer 17 and the first magnetization fixed layer 31 constitute an MTJ device.

Also, a second insulating layer 18 that serves a tunnel barrier layer (tunnel insulating layer) is provided between the storage layer 17 and the second magnetization fixed layer 32 of the upper layer and the storage layer 17 and the second magnetization fixed layer 32 constitute an MTJ device.

Further, in this embodiment, the intermediate layers provided above and below the storage layer 17, that is, the first insulating layer 16 and the second insulating layer 18 have a significant difference between sheet resistivity values thereof, for example, the first insulating layer 16 is relatively high in resistance and the second insulating layer 18 is relatively low in resistance.

Then, a magnetoresistance variation of the high resistance side (for example, the first insulating layer 16 side) is larger than that of the low resistance side (for example, second insulating layer 18 side) or a sheet resistivity value of the high resistance side (for example, first insulating layer 16 side) is more than twice of a sheet resistivity value of the low resistance side (for example, first insulating layer 16 side).

To realize the above-mentioned arrangement, the first and second insulating layers 16 and 18 may be made of materials with different insulating properties and the degrees of oxidation and nitriding may be made different by making the oxidation time and the nitriding time used when the first and second insulating layers 16 and 18 become different.

Then, since the two ferromagnetic layers 13 and 15 of the first magnetization fixed layer 31 have the lamination layer ferri structures, the magnetization M13 of the ferromagnetic layer 13 is directed in the right-hand side and the magnetization M15 of the ferromagnetic layer 15 is directed in the left-hand side and thereby the magnetizations M13 and M15 are directed in the opposite directions.

A magnetization M19 of the ferromagnetic layer 19 of the second magnetization fixed layer 32 is directed in the right-hand side.

Specifically, the magnetization M15 of the ferromagnetic layer 15 of the first magnetization fixed layer 31 and which is closest to the storage layer 17 is directed in the left-hand side and the magnetization M19 of the ferromagnetic layer 19 of the second magnetization fixed layer 32 is directed in the right-hand side and thereby the magnetization M15 and the magnetization M19 are directed in the opposite directions.

As described above, in the magnetization fixed layers 31 and 32 across the storage layer 17, since the magnetizations M15 and M19 of the ferromagnetic layers 15 and 19 closest to the storage layer 17 are directed in the opposite direction, the spin injection efficiency can be increased, whereby an electric current amount necessary for inverting the direction of the magnetization M1 of the storage layer 17 by spin injection can be decreased.

The storage element 3 according to this embodiment can be manufactured in such a fashion that after the layers from the underlayer 11 to the capping layer 21 were continuously formed within a vacuum system, the pattern of the storage element 3 may be formed by processing such as etching and thereby the storage element 3 can be manufactured.

According to the above-mentioned embodiment, in the magnetization fixed layers 31 and 32 across the storage layer 17 of the storage element 3, since the magnetizations M15 and M19 of the ferromagnetic layers 15 and 19, which are respectively closest to the storage layer 17, are directed in the opposite directions, the spin injection efficiency can be increased. As a consequence, it is possible to decrease the electric current amount necessary for inverting the direction of the magnetization M1 of the storage layer 17 by spin injection.

Also, according to the above-mentioned embodiment, since the intermediate layer between the storage layer 17 and the first magnetization fixed layer 31 below the storage layer 17 is the first insulating layer 16 and the intermediate layer between the storage layer 17 and the second magnetization fixed layer 32 above the storage layer 17 is the second insulating layer 18 and both of the intermediate layers are the insulating layers, it becomes possible to obtain sufficient spin injection efficiency by suppressing attenuation of spin current. As a consequence, by further improving the spin injection efficiency, it is possible to decrease an electric current amount necessary for inverting the direction of the magnetization M1 of the storage layer 17 based on the spin injection.

Specifically, the electric current amount required to record information in the storage element 3 can be decreased, and power consumption of the memory including the storage element 3 can be decreased.

Accordingly, it becomes possible to realize a memory with low power consumption that has never existed before.

Further, according to this embodiment, the first insulating layer 16 and the second insulating layer 18 have a significant difference between sheet resistivity values thereof and the magnetoresistance variation of the high resistance side (for example, the first insulating layer 16 side) is larger than that of the low resistance side (for example, the second insulating layer 18 side). Alternatively, the sheet resistivity value of the high resistance side (for example, the first insulating layer 16 side) is greater than twice the sheet resistivity value of the low resistance side (for example, the first insulating layer 16 side). Thus, since the amount in which the magnetoresistance variation of the high resistance side is canceled out by the magnetoresistance variation of the low resistance side can be decreased so that a large magnetoresistance variation can be obtained in the whole of the storage element 3.

As described above, since the magnetoresistance variation of the storage element 3 is sufficiently large, if information is read out from the storage layer 17 of the storage element 3 by using the magnetoresistive change, then high output can be obtained and hence information can be easily read out from the storage layer 17 of the memory element 3.

In consequence, in the memory including the storage element 3, it becomes possible to decrease power consumption required upon reading by decreasing an electric current flowing through the storage element 3 when information is read out from the storage element 3 or it becomes possible to simplify an arrangement such as a circuit to detect an output.

Figure 6:
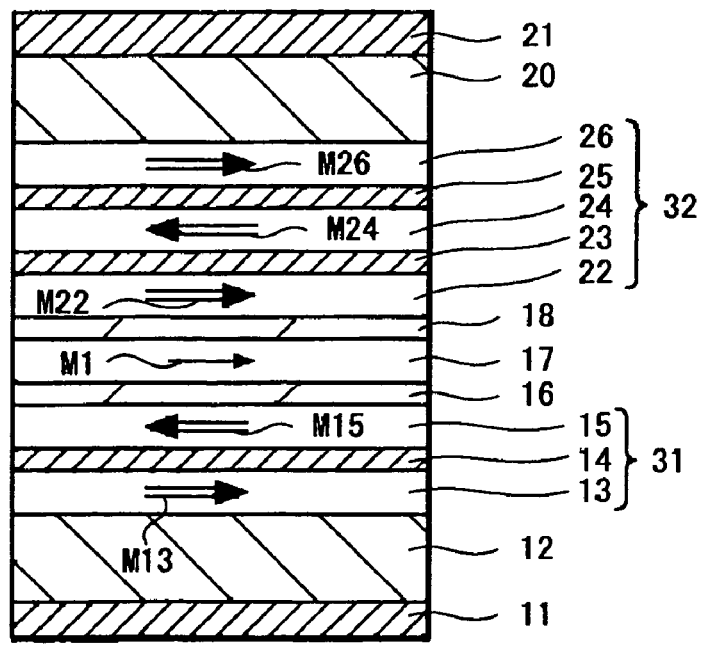
FIG. 6 is a cross-sectional view showing a storage element according to another embodiment of the present invention.

FIG. 6 is a schematic cross-sectional view showing a storage element constructing a memory according to another embodiment of the present invention.

As shown in FIG. 6, this storage element 30 includes a second magnetization fixed layer 32 having a lamination layer ferri structure.

Specifically, the second magnetization fixed layer 32 has an arrangement in which ferromagnetic layers 22, 24 and 26 of three layers are laminated through nonmagnetic layers 23 and 25 and thereby bonded together in an antiferromagnetic bond fashion.

Then, since the respective ferromagnetic layers 22, 24 and 26 of the second magnetization fixed layer 32 are laminated so as to have the lamination layer ferri structure, a magnetization M22 of the ferromagnetic layer 22 is directed in the right-hand side, a magnetization M24 of the ferromagnetic layer 24 is directed in the left-hand side, a magnetization M26 of the ferromagnetic layer 26 is directed in the right-hand side and thereby the magnetizations M22, M24 and M26 are directed in the directions opposite to each other.

As a result, magnetic fluxes leaked from the respective ferromagnetic layers 22, 24 and 26 of the second magnetization fixed layer 32 are canceled each other out.

Also, magnetic fluxes from the respective ferromagnetic layers 22, 24 and 26 within the second magnetization fixed layer 32 are counterbalanced with each other.

To be more concrete, in order that a synthesized magnetic field may become substantially zero in the second magnetization fixed layer 32, it is desirable that sums of products of saturation magnetizations of the ferromagnetic layers whose magnetizations are directed in the opposite directions and film thicknesses should be equal to each other, that is, the following relationship should be established.

$$Ms22 \cdot t22 + Ms26 \cdot t26 = Ms24 \cdot t24$$

where Ms22, Ms24 and Ms26 represent the saturation magnetizations of the ferromagnetic layers 22, 24 and 26, respectively, and t22, t24 and t26 represent the film thicknesses of the ferromagnetic layers 22, 24 and 26, respectively.

Further, in this embodiment, the magnetization M15 of the ferromagnetic layer 15 closest to the storage layer 17 in the first magnetization fixed layer 31 is directed in the left-hand side, the magnetization M22 of the ferromagnetic layer 22 closest to the storage layer 17 in the second magnetization fixed layer 32 is directed in the right-hand side and thereby the magnetizations M15 and M22 are directed in the directions opposite to each other.

As described above, in the magnetization fixed layers 31 and 32 across the storage layer 17, since the magnetizations M15 and M22 of the ferromagnetic layers 15 and 22 closest to the storage layer 17 are directed in the directions opposite to each other, spin injection efficiency can be increased and hence it is possible to decrease the electric current amount necessary for inverting the magnetization direction of the storage layer 17 based on the spin injection.

Figure 5:
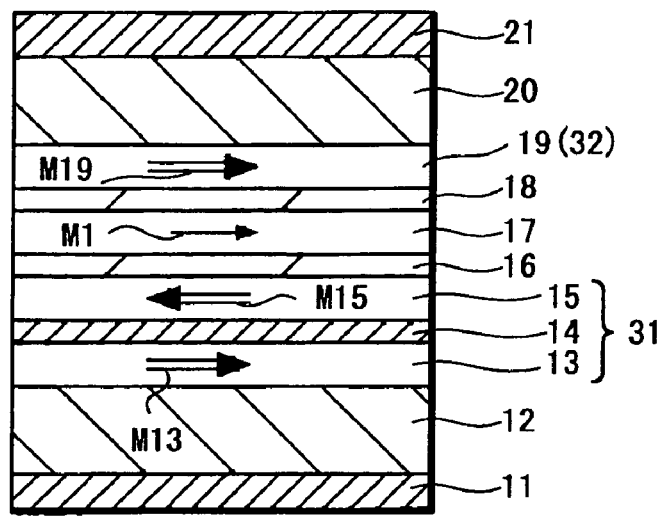
FIG. 5 is a cross-sectional view of a storage element shown in FIG. 4.

A rest of the arrangement shown in FIG. 6 is similar to that of the storage element 3 shown in FIG. 5. Therefore, in FIG. 6, elements and parts identical to those of FIG. 5 are denoted by identical reference numerals and need not be described.

Specifically, the first and second insulating layers 16 and 18 have a significant difference between the sheet resistivity values thereof similarly to the storage element 3 of the preceding embodiment shown in FIG. 5. Thus, the magnetoresistance variation of the high resistance side (for example, the first insulating layer 16 side) is larger than that of the low resistance side (for example, the second insulating layer 18 side) or the sheet resistivity value of the high resistance side (for example, the first insulating layer 16 side) is greater than twice the sheet resistivity value of the low resistance side (for example, the second insulating layer 18 side).

Also, a memory having a similar arrangement to that of the memory shown in FIG. 4 can be constructed by using the storage element 30 according to this embodiment.

Specifically, the storage element 30 is located neat the intersection point between the two kinds of the address wirings to construct the memory. An electric current in the upper and lower direction (lamination layer direction) flows through the two kinds of the wirings to the storage element 30 and the magnetization direction of the storage layer 17 is inverted by the spin injection to thereby record information on the storage element 30.

According to the above-mentioned embodiment, similarly to the preceding embodiment, in the magnetization fixed layers 31 and 32 across the storage layer 17 of the storage element 30, since the magnetizations M15 and M22 of the ferromagnetic layers 15 and 22 closest to the storage layer 17 are directed in the directions opposite to each other, it is possible to increase the spin injection efficiency. As a consequence, it is possible to decrease the electric current amount required to invert the direction of the magnetization M1 of the storage layer 17 based on the spin injection.

Also, since the intermediate layer between the storage layer 17 and the first magnetization fixed layer 31 provided below the storage layer 17 is the first insulating layer 16, the intermediate layer between the storage layer 17 and the second magnetization fixed layer 32 provided above the storage layer 17 is the second insulating layer 18 and both of the intermediate layers 16 and 18 are the insulating layers, it becomes possible to obtain a sufficient spin injection efficiency by suppressing an attenuation of spin current. Thus, the spin injection efficiency is further improved, whereby the electric current amount required to invert the direction of the magnetization M1 of the storage layer 17 based on the spin injection can be decreased.

That is, since the electric current amount necessary for recording information on the storage element 30, it is possible to decrease power consumption in the memory including the storage element 30.

Accordingly, it becomes possible to realize a memory with low power consumption that has never existed before.

Further, according to this embodiment, similarly to the preceding embodiment, the first insulating layer 16 and the second insulating layer 18 have a significant difference between the sheet resistivity values thereof. Therefore, the magnetoresistance variation of the high resistance side (for example, the first insulating layer 16 side) is larger than that of the low resistance side (for example, the second insulating layer 18 side) or the sheet resistivity value of the high resistance side (for example, the first insulating layer 16 side) is greater than twice the sheet resistivity value of the low resistance side (for example, the second insulating layer 18 side). As a consequence, the amount in which the magnetoresistance variation of the high resistance side is canceled out by that of the low resistance side can be decreased and hence it is possible to obtain a large magnetoresistance variation in the whole of the storage element 30.

As described above, since the magnetoresistance variation of the storage element 30 is sufficiently large, if information is read out from the storage layer 17 of the storage element 30 by using the magnetoresistive change, then a high output can be obtained and hence it is possible to easily read information from the storage layer 17 of the storage element 30.

Consequently, in the memory including the storage element 30, it becomes possible to decrease power consumption required upon reading by decreasing the electric current flowing through the storage element 30 when information is read out from the storage layer 17 of the storage element 30 and also it becomes possible to simplify the arrangement such as the circuit for detecting the output.

While the first insulating layer 16 provided below the storage layer 17 is relatively high in resistance and the second insulating layer 18 provided above the storage layer 17 is relatively low in resistance as described above in the above-mentioned respective embodiments, the present invention is not limited thereto and such a variant is also possible, in which the insulating layer provided below the storage layer may be relatively low in resistance and the insulating layer provided above the storage layer may be relatively high in resistance.

Inventive Examples

In the arrangement of the storage element according to the present invention, specific materials and film thicknesses of respective layers and the like were selected and magnetoresistive properties of the storage element were examined.

In actual practice, although a memory includes a switching semiconductor circuit and the like other than the storage element as shown in FIGS. 4 and 2, for the purpose of checking magnetoresistive properties of storage layers, magnetoresistive properties of storage layers were examined by using wafers on which only storage elements were formed.

(Film Arrangement 1: Samples 1 to 4)

First, a thermal oxide film having a film thickness of 2 μm was deposited on a silicon substrate having a film thickness of 0.575 mm and the storage element 3 having the arrangement shown in FIG. 5 was formed.

Specifically, in the storage element 3 having the arrangement shown in FIG. 5, the underlayer 11 was selected to be a Ta film having a film thickness of 3 nm, the antiferromagnetic layer 12 was selected to be PtMn film having a film thickness of 20 nm, the ferromagnetic layers 13 and 15 constructing the first magnetization fixed layer 31 were selected to be a $Co_{90}Fe_{10}$ film having a film thickness of 2 nm, the nonmagnetic layers 14, 20 and 22 constructing the magnetization fixed layers 31 and 32 having the lamination layer ferri structure were selected to be a Ru film having a film thickness of 0.8 nm, the first insulating layer 16 serving as the tunnel insulating layer was selected to be an aluminum oxide film obtained by oxidizing an Al film having a film thickness of 0.5 nm, the storage layer 17 was selected to be a lamination layer film of a $Co_{60}Fe_{40}$ film having a film thickness of 2 nm and a $Co_{90}Fe_{10}$ film having a film thickness of 2 nm, the second insulating layer 18 was selected to be an aluminum oxide film obtained by oxidizing an Al film having a film thickness of 0.4 nm, the ferromagnetic layer 19 constructing the second magnetization fixed layer 32 was selected to be a $Co_{90}Fe_{10}$ film having a film thickness of 2.5 nm, the antiferromagnetic layer 20 was selected to be a PtMn film having a film thickness of 30 nm and the capping layer 21 was selected to be a Ta film having a film thickness of 5 nm. Also, a Cu film (film that serves as a word line which will be described later on) having a film thickness of 100 nm, not shown, was provided between the underlayer 11 and the antiferromagnetic layer 12 and thereby the respective layers were formed.

Specifically, materials and film thicknesses of the respective layers were selected to be the following arrangement (film arrangement 1) and the storage element 3 was manufactured.

Film Arrangement 1:

Ta(3 nm)/Cu(100 nm)/PtMn(20 nm)/$Co_{90}Fe_{10}$(2 nm)/
Ru(0.8 nm)/$Co_{90}Fe_{10}$(2 nm)/Al(0.5 nm)–Ox/
$Co_{60}Fe_{40}$(2 nm)/$Co_{90}Fe_{10}$(2 nm)/Al(0.4 nm)–
Ox/$Co_{90}Fe_{10}$(2.5 nm)/PtMn(30 nm)/Ta(5 nm)

In the above-described film arrangement, a composition of PtMn of which alloy composition is not shown was selected to be $Pt_{50}Mn_{50}$ (atomic %).

The respective layers other than the insulating layers 16 and 18 formed of the aluminum oxide film were deposited by a DC magnetron sputtering method.

The insulating layers 16 and 18 formed of the aluminum oxide film ($Al-O_x$) film were formed as follows. First, a metal Al film was deposited with a thickness of 0.5 nm or 0.4 nm by a DC sputtering method. Thereafter, the metal Al layer was oxidized by a native oxide method at an oxygen/argon flow rate of 1:1. Then, the first insulating layer 16 on the high resistance side was adjusted in resistance value by an oxidation time under chamber gas pressure of 10 Torr. Similarly, the second insulating layer 18 on the low resistance side was adjusted in resistance value by an oxidation time under chamber gas pressure of 1 Torr.

Further, after the respective layers of the storage element 3 were deposited, the resultant product was annealed in a field anneal furnace under magnetic field of 10 kOe at 270° C. for 4 hours and PtMn films of the antiferromagnetic layers 12 and 20 were annealed for ordering.

Next, after a word line portion was masked by photolithography, a word line (lower electrode) was formed by effecting selective etching on the lamination layer film of the portion other than the word line in the atmosphere of Ar plasma. At that time, other portions than the word line were etched up to 5 nm in the depth of the substrate.

After that, a mask of a pattern of the storage element 3 was formed by an electron beam lithography system and the storage element 3 was formed by effecting selective etching on the lamination layer film. Other portions than the word line were etched right before the Cu layer of the word line.

In storage elements for evaluating characteristics, since a sufficient electric current should flow through the storage element in order to generate spin torque necessary for magnetization inversion, a resistance value of the tunnel insulating layer should be suppressed. Therefore, the pattern of the storage element 3 was shaped like an ellipse having a minor axis of 0.09 μm×a major axis of 0.18 μm.

Next, other portions than the storage element 3 were insulated by sputtering an $Al_2O_3$ layer having a film thickness of about 100 nm.

Thereafter, bit lines serving as upper electrodes and measurement pads were formed and samples of storage elements were manufactured.

By the above-described manufacturing method, respective test samples of storage elements of samples 1 to 4 in which the oxidation times to form the insulating layers were changed were manufactured.

In the samples 1 and 2, the oxidation time of the second insulating layer 18 was relatively shortened and the sheet resistivity value was lowered. In the sample 3, a difference between the sheet resistivity values was decreased by making the oxidation time of the second insulating layer 18 close to that of the first insulating layer 16. In the sample 4, a sheet resistivity value was increased by lengthening the oxidation time of the first insulating layer 16.

The oxidation time of the first insulating layer 16 was the same in the samples 1 to 3. The oxidation time of the second insulating layer 18 was the same in the samples 3 and 4.

(Film Arrangement 2: Samples 5 to 7)

The second insulating layer 18 of the upper layer (low resistance) was formed of an aluminum nitride film and a rest of arrangement was selected to be similar to that of the film arrangement 1, whereafter a storage element was manufactured. The aluminum nitride film was deposited so as to have a thickness of 0.4 nm by treating a metal Al film in accordance with a DC sputtering method. After that, an Al film was nitrided in the atmosphere of a mixed gas of argon (Ar) and nitrogen (Ni) and thereby an $AlN_x$ was formed.

Specifically, materials and film thicknesses of respective layers were selected to be those in the following arrangement (film arrangement 2) and then the storage element was manufactured. The film arrangement 2:

Ta(3 nm)/Cu(100 nm)/PtMn(20 nm)/$Co_{90}Fe_{10}$(2 nm)/
Ru(0.8 nm)/$Co_{90}Fe_{10}$(2 nm)/Al(0.5 nm)–Ox/
$Co_{60}Fe_{40}$(2 nm)/$Co_{90}Fe_{10}$(2 nm)/Al(0.4 nm)–
Nx/$Co_{90}Fe_{10}$(2.5 nm)/PtMn(30 nm)/Ta(5 nm)

Then, in this film arrangement 2, the test samples of storage elements of samples 5 to 7 in which oxidation times to form insulating layers were manufactured, respectively.

In the samples 5 and 6, the sheet resistivity value was lowered by relatively shortening the nitriding time of the second insulating layer 18. In the sample 7, a difference between sheet resistivity values was decreased by slightly lengthening the nitriding time of the second insulating layer 18.

The nitriding time of the second insulating layer 18 was the same in the samples 5 and 6.

(Film Arrangement 3: Samples 8 to 11)

The first insulating layer 16 of the lower layer (high resistance) was formed of an MgO (magnesium oxide) film having a film thickness of 1 nm. A rest of arrangement was selected to be similar to that of the film arrangement 1 and thereby a storage element was formed. The MgO film was formed by directly depositing oxide in accordance with an RF sputtering method.

Specifically, materials and film thicknesses of respective layers were selected to be those in the following arrangement (film arrangement 3) and thereby the storage element was manufactured. The film arrangement 3:

Ta(3 nm)/Cu(100 nm)/PtMn(20 nm)/$Co_{90}Fe_{10}$(2 nm)/
Ru(0.8 nm)/$Co_{90}Fe_{10}$(2 nm)/MgO(1 nm)/
$Co_{60}Fe_{40}$(2 nm)/$Co_{90}Fe_{10}$(2 nm)/Al(0.4 nm)–
Ox/$Co_{90}Fe_{10}$(2.5 nm)/PtMn(30 nm)/Ta(5 nm)

Then, in this film arrangement 3, test samples of storage elements of samples 8 to 11 in which oxidation times to form insulating layers were changed were manufactured, respectively.

In the samples 8 and 9, the sheet resistivity value was lowered by relatively shortening the oxidation time of the second insulating layer 18. In the sample 10, a difference between sheet resistivity values was decreased by slightly lengthening the oxidation time of the second insulating layer 18. In the sample 11, the sheet resistivity value of the first insulating layer 16 was increased.

The oxidation times of the second insulating layer 18 were the same in the samples 8 and 9 and in the samples 10 and 11, respectively.

(Film Arrangement 4: Sample 12)

A Pt film having a film thickness of 0.5 nm was formed between the second insulating layer 18 of the upper layer (low resistance) and the magnetic layer 19 constructing the second magnetization fixed layer 32. A rest of arrangement was selected to be similar to that of the film arrangement 1 and thereby a storage element was manufactured.

Specifically, materials and film thicknesses of respective layers were selected to be those in the following arrangement (film arrangement 4) and the storage element was manufactured. The film arrangement 4:

Ta(3 nm)/Cu(100 nm)/PtMn(20 nm)/$Co_{90}Fe_{10}$(2 nm)/
Ru(0.8 nm)/$Co_{90}Fe_{10}$(2 nm)/Al(0.5 nm)–Ox/
$Co_{60}Fe40$(2 nm)/$Co_{90}Fe_{10}$(2 nm)Al(0.4 nm)–Ox/
Pt(0.5 nm)/$Co_{90}Fe_{10}$(2.5 nm)/PtMn(30 nm)/Ta(5 nm)

This storage element was used as the test sample of the storage element of the sample 12.

(Film Arrangement 5: Sample 13)

A film thickness of a Pt film was selected to be 3 nm. A rest of arrangement was selected to be similar to that of the film arrangement 4 and a storage element was manufactured.

Specifically, materials and film thicknesses of respective layers were selected to be those in the following arrangement (film arrangement 5) and the storage element was manufactured. The film arrangement 5:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/Al(0.5 nm)-Ox/
Co$_{60}$Fe$_{40}$(2 nm)/Co$_{90}$Fe$_{10}$(2 nm)/Al(0.4 nm)-
Ox/Pt(3 nm)/Co$_{90}$Fe$_{10}$(2.5 nm)/PtMn(30 nm)/
Ta(5 nm)

This storage element was used as a test sample of a storage element of a sample 13.

(Film Arrangement 6: Sample 14)

A Ru film having a film thickness of 0.5 nm was formed between the storage layer 17 and the second insulating layer 18 of the upper layer (low resistance). A rest of arrangement was selected to be similar to that of the film arrangement 1 and thereby the storage element was manufactured.

Specifically, materials and film thicknesses of respective layers were selected to be those in the following arrangement (film arrangement 6) and the storage element was manufactured. The film arrangement 6:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/Al(0.5 nm)-Ox/
Co$_{60}$Fe$_{40}$(2 nm)/Co$_{90}$Fe$_{10}$(2 nm)/Ru(0.5 nm)/Al
(0.4 nm)-Ox/Co$_{90}$Fe$_{10}$(2.5 nm)/PtMn(30 nm)/
Ta(5 nm)

This storage element was used as a test sample of a storage element of a sample 14.

(Film Arrangement 7: Sample 15)

A film thickness of the Ru film formed between the storage layer 17 and the second insulating layer 18 of the upper layer (low resistance) was selected to be 2.5 nm. Then, a rest of arrangement was selected to be similar to that of the film arrangement 6 and thereby the storage element was manufactured.

Specifically, materials and film thicknesses of respective layers were selected to be those in the following arrangement (film arrangement 7) and thereby the storage element was manufactured. The film arrangement 7:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/Al(0.5 nm)-Ox/
Co$_{60}$Fe$_{40}$(2 nm)/Co$_{90}$Fe$_{10}$(2 nm)/Ru(2.5 nm)/Al
(0.4 nm)-Ox/Co$_{90}$Fe$_{10}$(2.5 nm)/PtMn(30 nm)/
Ta(5 nm)

This storage element was used as a test sample of a storage element of a sample 15.

(Film Arrangement 8: Sample 16)

The second insulating layer 18 of the upper layer (low resistance) was formed of an MgO film having a film thickness of 0.4 nm. A rest of arrangement was selected to be similar to that of the film arrangement 3 and thereby a storage element was manufactured. That is, the first insulating layer 16 of the lower layer and the second insulating layer 18 of the upper layer were both formed of the MgO films and the MgO films had different thicknesses.

Specifically, materials and film thicknesses of respective layers were selected to be those in the following arrangement (film arrangement 8) and thereby the storage element was manufactured. The film arrangement 8:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/MgO(1 nm)/
Co$_{60}$Fe$_{40}$(2 nm)/Co$_{90}$Fe$_{10}$(2 nm)/MgO(0.4 nm)/
Co$_{90}$Fe$_{10}$(2.5 nm)/PtMn(30 nm)/Ta(5 nm)

This storage element was used as a test sample o a storage element of a sample 16.

(Film Arrangement 9: Sample 17)

A Ru film having a film thickness of 0.5 nm was formed between the storage layer 17 and the second insulating layer 18 of the upper layer (low resistance). Then, a rest of arrangement was selected to be similar to that of the film arrangement 8 and thereby a storage element was manufactured.

Specifically, materials and film thicknesses of respective layers were selected to be those in the following arrangement (film arrangement 9) and thereby the storage element was manufactured. The film arrangement 9:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/MgO(1 nm)/
Co$_{60}$Fe$_{40}$(2 nm)/Co$_{90}$Fe$_{10}$(2 nm)/Ru(0.5 nm)/
MgO(0.4 nm)/Co$_{90}$Fe$_{10}$(2.5 nm)/PtMn(30 nm)/
Ta(5 nm)

This storage element was used as a test sample of a storage element of a sample 17.

(Film Arrangement 10: Sample 18)

The first insulating layer 16 of the lower layer (high resistance) was formed of an aluminum nitride film which was obtained by nitriding a metal Al film having a film thickness of 0.5 nm. A rest of arrangement was selected to be similar to those of the film arrangement 2 and thereby a storage element was manufactured. Specifically, the first insulating layer 16 of the lower layer and the second insulating layer 18 of the upper layer were both formed of aluminum nitride films and the aluminum nitride films had different film thicknesses.

Specifically, materials and film thicknesses of respective layers were selected to be those in the following arrangement (film arrangement 10) and thereby a storage element was manufactured. Film arrangement:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/Al(0.5 nm)-Nx/
Co$_{60}$Fe$_{40}$(2 nm)/Co$_{90}$Fe$_{10}$(2 nm)/Al(0.4 nm)-
Nx/Co$_{90}$Fe$_{10}$(2.5 nm)/PtMn(30 nm)/Ta(5 nm)

This storage element was used as a test sample of a storage element of a sample 18.

(Film Arrangement 11: Sample 19)

Respective layers up to the insulating layer 16 were formed similarly to the film arrangement 1 and a storage layer was formed of a lamination layer structure composed of a Co$_{60}$Fe$_{40}$ film having a film thickness of 2 nm and an NiFe film having a film thickness of 4 nm and on which a capping layer was formed, thereby resulting in a storage element being manufactured. That is, this arrangement is the arrangement of the ordinary spin injection storage element in which the magnetization fixed layer is provided only on one side of the storage layer.

Specifically, materials and film thicknesses of respective layers were selected to be those in the following arrangement (film arrangement 11) and thereby a storage element was manufactured.

Film Arrangement 11:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/Al(0.5 nm)-Ox/
Co$_{60}$Fe$_{40}$(2 nm)/NiFe(4 nm)/Ta(5 nm)

This storage element was used as a test sample of a storage element of a sample 19.

(Film Arrangement 12: Sample 20)

The intermediate layer between the storage layer and the second magnetization fixed layer of the upper layer was not formed of the insulating layer but formed of a Cu film having a film thickness of 6 nm which was a nonmagnetic conductive layer. A rest of arrangement was selected to be similar to that of the film arrangement 1 and thereby a storage element was manufactured.

Specifically, materials and film thicknesses of respective layers were selected to be those in the following arrangement (film arrangement 12) and thereby a storage element was manufactured.

Film Arrangement 12:

Ta(3 nm)/Cu(100 nm)/PtMn(20 nm)/Co$_{90}$Fe$_{10}$(2 nm)/
Ru(0.8 nm)/Co$_{90}$Fe$_{10}$(2 nm)/Al(0.5 nm)–Ox/
Co$_{60}$Fe$_{40}$(2 nm)/Co$_{90}$Fe$_{10}$(2 nm)/Cu(6
nm)Co$_{90}$Fe$_{10}$(2.5 nm)/PtMn(30 nm)/Ta(5 nm)

This storage element was used as a test sample of a storage element of a sample 20.

Characteristics of the above-mentioned storage elements of the respective samples were respectively evaluated as follows.

Prior to measurements, in order that values of the plus (positive) direction and the minus (negative) direction of an inverting electric current may be controlled so as to become symmetric, a magnetic field can be applied to the storage element from the outside. Also, an amount of an electric current flowing through the storage element may be set so as to reach 1.2 mA which falls within a range in which the insulating layers 16 and 18 may be prevented from being broken.

(Measurement of Sheet Resistivity Value)

First, resistance values of the whole of the storage elements were measured.

Also, with respect to the storage elements of the above-mentioned respective samples, the magnetoresistive elements (portions of the first ferromagnetic layer 12, the first magnetization fixed layer 31, the first insulating layer 16 and the storage layer 17) of the respective lower half portions were separately manufactured and their resistance values were measured.

Then, a first sheet resistivity value corresponding to the first insulating layer of the lower side and a second sheet resistivity value corresponding to the second insulating layer of the upper layer were calculated from the resistance values of the whole of the storage elements and the resistance values of the magnetoresistive elements of the lower half portion.

(Measurement of Inverting Electric Current Value and TMR Ratio)

With application of an electric current to the storage elements, resistance values of the storage elements through which the electric current flowed were measured. When the resistance values of the storage elements were measured, a temperature was set to a room temperature of 25° C. and a bias voltage applied to the terminals of the word lines and the terminals of the bit lines are adjusted so as to reach 10 mV. Further, while an amount of an electric current flowing through the storage element was being changed, the resistance value of this storage element was measured and a resistance-current curve was obtained from the measured result. The measurement to obtain this resistance-electric current curve was effected on electric currents of both polarities (plus direction and minus direction).

An electric current value at which the resistance value is changed was calculated from this resistance-electric current curve and the thus calculated electric current value was set to an inverting electric current value for inverting the direction of magnetization. This inverting electric current value was obtained from electric currents of both polarities. Further, a mean value of absolute values of inverting electric current values of both polarities was calculated and the thus calculated mean value was used as an inverting electric current.

Also, a ratio between a resistance value obtained in the state in which the magnetization directions of the magnetization fixed layer and the storage layer of the MTJ element side are anti-parallel to each other and in which the resistance is high and a resistance value obtained in the state in which the magnetization directions of the magnetization fixed layer and the storage layer are parallel to each other and in which the resistance is low was calculated and the thus calculated ratio was set to a TMR ratio.

The following table 1 (formed of tables 1A and 1B for conveniences' sake of size of table) shows obtained results altogether.

TABLE 1A

| Sample No. | Film Arrangement | First Sheet Resistivity value (Ω μm2) | Second Sheet Resistivity value (Ω μm2) | TMR ratio (%) |
|---|---|---|---|---|
| 1 | 1 | 15 | 4 | 36 |
| 2 | 1 | 15 | 1 | 41 |
| 3 | 1 | 15 | 10 | 23 |
| 4 | 1 | 160 | 10 | 46 |
| 5 | 2 | 20 | 5 | 34 |
| 6 | 2 | 50 | 5 | 42 |
| 7 | 2 | 30 | 20 | 22 |
| 8 | 3 | 15 | 2 | 58 |
| 9 | 3 | 60 | 2 | 71 |
| 10 | 3 | 30 | 20 | 27 |
| 11 | 3 | 180 | 20 | 89 |
| 12 | 4 | 15 | 2 | 43 |
| 13 | 5 | 15 | 3 | 41 |
| 14 | 6 | 15 | 2 | 44 |
| 15 | 7 | 50 | 10 | 39 |
| 16 | 8 | 30 | 8 | 62 |
| 17 | 9 | 15 | 5 | 54 |
| 18 | 10 | 100 | 10 | 42 |
| 19 | 11 | 15 | — | 33 |
| 20 | 12 | 15 | <1 | 44 |

TABLE 1B

| Sample No. | Inverting Electric current +side (mA) | Inverting Electric current −side (mA) | Inverting Electric current (mA) | Remarks |
|---|---|---|---|---|
| 1 | +0.50 | −0.30 | 0.40 | Inventive Example |
| 2 | +0.55 | −0.35 | 0.45 | Inventive Example |
| 3 | +0.75 | −0.45 | 0.60 | Comparative Example |
| 4 | Element Broken | Element Broken | Element Broken | Comparative Example |
| 5 | +0.50 | −0.40 | 0.45 | Inventive Example |
| 6 | +0.45 | −0.25 | 0.35 | Inventive Example |
| 7 | +0.80 | −0.60 | 0.70 | Comparative Example |
| 8 | +0.55 | −0.35 | 0.45 | Inventive Example |
| 9 | +0.40 | −0.30 | 0.35 | Inventive Example |
| 10 | +0.65 | −0.45 | 0.55 | Comparative Example |
| 11 | Element Broken | Element Broken | Element Broken | Comparative Example |
| 12 | +0.50 | −0.20 | 0.35 | Inventive Example |
| 13 | +1.20 | −0.90 | 1.05 | Comparative Example |
| 14 | +0.50 | −0.30 | 0.40 | Inventive Example |

TABLE 1B-continued

| Sample No. | Inverting Electric current +side (mA) | Inverting Electric current −side (mA) | Inverting Electric current (mA) | Remarks |
|---|---|---|---|---|
| 15 | +1.20 | −1.00 | 1.10 | Comparative Example |
| 16 | +0.55 | −0.35 | 0.45 | Comparative Example |
| 17 | +0.50 | −0.30 | 0.40 | Inventive Example |
| 18 | +0.60 | −0.40 | 0.50 | Inventive Example |
| 19 | +1.15 | −0.85 | 1.10 | Comparative Example |
| 20 | +1.20 | −1.00 | 1.10 | Comparative Example |

A study of the table 1 reveals that the samples of the inventive examples with the arrangements of the present invention can obtain TMR ratios of greater than 30% and that the magnetization inverting electric current can be decreased to be less than 0.5 mA.

On the other hand, of the samples of the comparative examples, in the samples 3, 7 and 10 in which the difference between the first and second sheet resistivity values is small, TMR ratios were low and became less than 30%.

Also, in the samples 4 and 11 in which the first sheet resistivity value is large, the magnetization inverting electric current became very large and the elements were broken with application of the magnetization inverting electric current.

Further, in the samples 13 and 15 in which the nonmagnetic conductive layer inserted into the interface of the second insulating layer has the large thickness, the magnetization inverting electric current became large.

Further, in the sample 19 in which the magnetization fixed layer is provided only on one side of the storage layer, the magnetization inverting electric current is large.

Furthermore, in the sample 20 in which the intermediate layer provided above the storage layer is formed of the nonmagnetic conductive layer, since the intermediate layer is the conductive layer, the second sheet resistivity value is decreased and the magnetization inverting electric current is increased.

Accordingly, if the storage element has the arrangement of the present invention like the samples of the respective inventive examples, then it is possible to write information in the storage layer at an electric current amount of less than 0.5 mA. Therefore, it becomes possible to realize a memory of a low power consumption type that has never existed in the past.

While the first insulating layer 16 of the lower layer is high in resistance in the above-mentioned respective samples, the present invention is not limited thereto and the following variant is also possible. That is, even when the second insulating layer 18 of the upper layer is made high in resistance, if the two insulating layers 16 and 18 have a significant difference between sheet resistivity values thereof in a like manner, then a TMR ratio can be increased and a recording electric current can be decreased.

According to the above-mentioned present invention, it is possible to decrease the electric current amount required to record information by improving the spin injection efficiency.

As a consequence, it becomes possible to decrease power consumption of the whole of the memory.

Accordingly, it becomes possible to realize the memory with low power consumption that has never existed in the related art.

Also, according to the present invention, when recorded information is read, high output can be obtained and hence it becomes possible to read information easily.

As a result, in the memory including the storage element, the electric current applied to the storage element when information is read, for example, can be decreased, whereby it becomes possible to decrease power consumption required upon reading and the arrangement such as a circuit for detecting an output can be simplified.

It should be understood by those skilled in the art that various modifications, combinations, sub-combinations and alterations may occur depending on design requirements and other factors insofar as they are within the scope of the appended claims or the equivalents thereof.

What is claimed is:

1. A storage element comprising:
a storage layer for storing therein information based on the magnetization state of a magnetic material; and
magnetization fixed layers provided above and below said storage layer;
intermediate layers between said magnetization fixed layers and said storage layer, both of said intermediate layers being formed of insulating layers, wherein magnetization directions of ferromagnetic layers closest to said storage layer are opposite to each other in said magnetization fixed layers above and below said storage layer, the magnetization direction of said storage layer is changed with application of an electric current to record information on said storage layer, said two intermediate layers above and below said storage layer have a difference between sheet resistivity values thereof and a magnetoresistance variation of said intermediate layer having a high sheet resistivity is larger than that of said intermediate layer having a low sheet resistivity.

2. A storage element comprising:
a storage layer for storing therein information based on the magnetization state of a magnetic material; and
magnetization fixed layers provided above and below said storage layer;
intermediate layers between said magnetization fixed layers and said storage layer, both of said intermediate layers being formed of insulating layers, wherein magnetization directions of ferromagnetic layers closest to said storage layer are opposite to each other in said magnetization fixed layers above and below said storage layer, the magnetization direction of said storage layer is changed with application of an electric current to record information on said storage layer, said two intermediate layers above and below said storage layer have a difference between sheet resistivity values thereof and a sheet resistivity value of one of said intermediate layers is larger than twice of a sheet resistivity value of the other of said intermediate layers.

3. A storage element according to claim 1, wherein said two intermediate layers are made of any one of oxide or nitride.

4. A storage element according to claim 2, wherein said two intermediate layers are made of any one of oxide or nitride.

5. A storage element according to claim 1, wherein said intermediate layers are mainly made of any one of aluminum oxide and aluminum nitride.

6. A storage element according to claim 2, wherein said intermediate layers are mainly made of any one of aluminum oxide and aluminum nitride.

7. A storage element according to claim 1, wherein one of said two intermediate layers is mainly made of magnesium oxide and the other is mainly made of any one of aluminum oxide, aluminum nitride and magnesium oxide.

8. A storage element according to claim 2, wherein one of said two intermediate layers is mainly made of magnesium oxide and the other is mainly made of any one of aluminum oxide, aluminum nitride and magnesium oxide.

9. A memory comprising:

a storage element including a storage layer for storing information based on the magnetization state of a magnetic material; and two kinds of wirings crossing to each other, wherein said storage element includes magnetization fixed layers provided above and below said storage layer and intermediate layers between said magnetization fixed layers and said storage layer, said two intermediate layers are all made of insulating layers, magnetization directions of ferromagnetic layers closest to said storage layer are opposite to each other in said magnetization fixed layers above and below said storage layer, the magnetization direction of said storage layer is changed with application of an electric current to record information on the storage layer, said two intermediate layers above and below said storage layer have a difference between sheet resistivity values thereof, magnetoresistance variation of said intermediate layer having a high sheet resistivity value is larger than that of said intermediate layer having a low sheet resistivity value, said storage element is located near an intersection point between said two kinds of wirings and between said two kinds of wirings and an electric current flows through said two kinds of wirings to said storage element.

10. A memory comprising:

a storage element including a storage layer for storing information based on the magnetization state of a magnetic material; and two kinds of wirings crossing to each other, wherein said storage element includes magnetization fixed layers provided above and below said storage layer and intermediate layers between said magnetization fixed layers and said storage layer, said two intermediate layers are all made of insulating layers, magnetization directions of ferromagnetic layers closest to said storage layer are opposite to each other in said magnetization fixed layers above and below said storage layer, the magnetization direction of said storage layer is changed with application of an electric current to record information on the storage layer, said two intermediate layers above and below said storage layer have a difference between sheet resistivity values thereof, a sheet resistivity value of one of said intermediate layers is larger than twice that of the other of said intermediate layer, said storage element is located near an intersection point between said two kinds of wirings and between said two kinds of wirings and an electric current flows through said two kinds of wirings to said storage element.

* * * * *

UNITED STATES PATENT AND TRADEMARK OFFICE
CERTIFICATE OF CORRECTION

| | | |
|---|---|---|
| PATENT NO. | : 7,888,755 B2 | Page 1 of 1 |
| APPLICATION NO. | : 11/235384 | |
| DATED | : February 15, 2011 | |
| INVENTOR(S) | : Masanori Hosomi et al. | |

It is certified that error appears in the above-identified patent and that said Letters Patent is hereby corrected as shown below:

Title Page, Item (73) should read

-- Assignees: Sony Corporation, Tokyo (JP)
Grandis, Inc., Milpitas, CA (US) --

Signed and Sealed this
Twenty-fifth Day of September, 2012

David J. Kappos
*Director of the United States Patent and Trademark Office*